United States Patent

Delos et al.

(10) Patent No.: US 7,272,521 B1
(45) Date of Patent: Sep. 18, 2007

(54) MEASUREMENT OF PHASE NONLINEARITY OF NON-LINEAR DEVICES

(75) Inventors: Peter L. Delos, Mt. Laurel, NJ (US);
David B. Zaff, Maple Shade, NJ (US);
Matthew W. Smith, Cherry Hill, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 3 days.

(21) Appl. No.: 11/058,520

(22) Filed: Feb. 15, 2005

(51) Int. Cl.
*G01R 25/00* (2006.01)
*H03D 13/00* (2006.01)

(52) U.S. Cl. .......................... 702/69; 702/72; 702/79; 324/76.83

(58) Field of Classification Search .................. 702/57, 702/58, 66, 69, 70–74, 79, 86, 89, 106, 108, 702/109, 117, 189, 190, 191; 324/76.77–76.79, 324/76.83, 85, 87; 375/226; 342/174
See application file for complete search history.

(56) References Cited

U.S. PATENT DOCUMENTS 4,968,968 A * 11/1990 Taylor ........................ 342/174
5,781,539 A * 7/1998 Tanaka ........................ 370/312

* cited by examiner

*Primary Examiner*—John Barlow
*Assistant Examiner*—Manuel L Barbee
(74) *Attorney, Agent, or Firm*—Duane Morris, LLP

(57) ABSTRACT

A method for determining the phase characteristics of a nonlinear analog device includes application of a test signal, which may be linear-FM, to the nonlinear device. The converted signal is digitized and mathematically converted to baseband in ideal fashion. A digitized version of the original test signal and the downconverted signal are phase compared to determine the phase error.

5 Claims, 3 Drawing Sheets

MEASUREMENT OF PHASE NONLINEARITY OF NON-LINEAR DEVICES

FIELD OF THE INVENTION

This invention relates to method and apparatus for measuring phase or phase error in situations in which the signal being measured has passed through a nonlinear device, whereby the signal is frequency multiplied or translated.

BACKGROUND OF THE INVENTION

Many modern sensing and communication devices, such as radar, sonar, and lidar in the case of sensors, and phase modulation communications, make extensive use of phase comparisons of variable-frequency signals to determine information content. One common variable-frequency signal is the linear-frequency-modulation (linear FM) signal, widely used in radar. In general, the amount of information which can be extracted from such devices depends upon the linearity of the linear FM signal. Many of these devices include nonlinear elements, such as frequency converters (upconverters or downconverters) for frequency translation, frequency multipliers for bandwidth expansion, or detectors. The nonlinear devices often adversely affect the phase, which is to say that the phase relationships of the signals entering the nonlinear device are different from those of the signals exiting the device. Moreover, the phase of signals exiting the nonlinear device at a given output frequency may be different from that of signals exiting at other frequencies. That is, the phase error introduced by a nonlinear device is not necessarily a constant, but may instead be a function of the frequency.

It is very desirable when designing systems using nonlinear devices to be able to determine the relative quality of different nonlinear devices which perform the same function, so as to be able to select for use that one device, or those devices, which least perturb the phase, and maximize the linearity of the linear FM. This selection allows the system being designed to extract the maximum possible information from the signals. Thus, phase measurements are made to determine the relative quality of each potential design of nonlinear device.

Prior-art methods for making phase measurements include, for example, applying frequency-swept or linear-frequency-modulated (linear FM) input signal to a nonlinear device, for producing frequency upconverted, frequency multiplied, or detected signals. The output signal from the nonlinear device will, in general, be different from the input signal. In order to compare the phase of the output signal to the input signal, the frequency upconverted or multiplied signal is downconverted back to the original frequency, as by use of a downconverter using the same local oscillator as the upconverter. The phases of the input signal and the downconverted signal can then be directly compared in phase. Thus, this prior-art method requires the use of a second nonlinear device in addition to the upconverter, namely the downconverter. If a downconverter were to be the nonlinear device being tested, the upconverter would be the extra nonlinear device. Unfortunately, this technique only provides an indication of the phase error of a cascade of nonlinear elements, and not of one element alone. While one may make the assumption that the nonlinearity is evenly divided between the upconverter and the downconverter, this is merely an assumption, and it can be very difficult to determine the actual phase errors or contributions of each of the upconverter and downconverter separately. Network analyzer devices currently on the market use this upconversion/downconversion technique, with the disadvantage that the calibration characteristics of the additional nonlinear device may not be well established.

In those cases in which the nonlinear device performs frequency expansion or contraction, as would be the case of frequency multipliers, there is no effective or standard prior art method for determining the phase characteristics of the nonlinear device.

Improved or alternative phase evaluation methods and apparatus are desired for use with nonlinear elements or devices.

SUMMARY OF THE INVENTION

A method according to a general aspect of the invention is for determining the phase characteristics of a nonlinear analog device. The method includes application of a test signal, which may be linear-FM, to the nonlinear device. The resulting converted signal is digitized and mathematically converted to baseband in ideal fashion. A digitized version of the original test signal and the downconverted signal are phase compared to determine the phase error.

A method according to an aspect of the invention is for determining the phase linearity of a nonlinear device or component. The method comprises the step of applying test signal to said nonlinear device to thereby produce desired signal. In a preferred embodiment of the invention, the test signal is a linear-FM signal. The test signal is applied to a digital emulation of the nonlinear device, to thereby produce an ideal representation of the desired signal. The phase of the desired signal is compared with that of that of the ideal representation.

In one mode of the method, the emulation of the nonlinear device is performed by a digital processor, which generates a signal representing the ideal representation of the desired signal. This ideal representation includes or inheres the ideal or perfect phase performance which it is possible to achieve. The phase of this ideal representation signal is compared with the actual output signal of the nonlinear device being tested in order to determine the error in phase between the ideal signal and the actual signal processed by the nonlinear device under test. In another mode of the invention, the emulation is performed by a digital filter which strips the ideal phase component from the output signal of the nonlinear device, and passes the difference or error between the ideal phase and the actual phase, producing phase error as an output signal. The representation of the ideal signal may be generated by either hardware or software.

A method according to an aspect of the invention is for determining the phase linearity of a nonlinear analog device which performs a frequency change function on signals applied thereto. The method comprises the step of applying test signal to the nonlinear analog device to thereby produce desired signal including unwanted errors attributable to the device. The test signal may be a linear FM "sweep." The method further includes the steps of applying the desired signal, including device errors, to a digital emulation filter representing the ideal reverse of the frequency change function, to thereby produce a representation of the original test signal, including errors attributable to the nonlinear device. The phase of the desired signal including device errors is compared with the phase of the representation of the original test signal, to thereby produce a signal representing the phase errors of the nonlinear device.

A method for determining the phase characteristics of a nonlinear analog device according to another aspect of the invention comprises the steps of applying a linear-FM signal to the analog device, for thereby producing desired signal with, or containing, errors, and digitizing the desired signal with errors, to thereby produce a sampled digital signal represented as $$s(k\Delta t, f_1, \mu) = \cos\left[2\pi\left(f_1 k\Delta t + \frac{\mu}{2}(k\Delta t)^2 + \varepsilon(k\Delta t)\right)\right] \quad (3)$$

where k=0, . . . , $N_{PW}$, and $T_{PW}=N_{PW}\cdot\Delta t$ and $\Delta t=1/fs$. The discrete Hilbert Transform, HT, of the sampled digital signal is taken, to thereby generate a one-sided spectrum. From the one-sided spectrum, a signal is produced of the form $$\bar{s}(k\Delta t) = s(k\Delta t) + jHT(s(k\Delta t)) = \exp\left(j2\pi\left(f_1 k\Delta t + \frac{\mu}{2}(k\Delta t)^2 + \varepsilon(k\Delta t)\right)\right) \quad (4)$$

where k=0, . . . , $N_{PW}$. The one-sided spectrum is mathematically converted to a baseband signal $$s_{BB}(k\Delta t) = \exp\left(j2\pi\left(-\frac{B}{2}k\Delta t + \frac{\mu}{2}(k\Delta t)^2 + (\varepsilon(k\Delta t))\right)\right). \quad (5)$$

An FFT is taken of the baseband signal to produce a frequency component representation of the baseband signal $$S_{BB}(n\Delta f)=FFT(s_{BB}(k\Delta t)) \quad (6).$$

The complex conjugate of the FFT of an ideal Linear-FM signal at baseband is generated to produce a complex conjugate signal of the form $$LFM_{BB}*(n\Delta f)=\text{conj}[FFT(LFM_{BB}(k\Delta t))] \quad (7).$$

A frequency component representation of the baseband signal is approximated as an approximation signal $$S_{BB}(n\Delta f) \approx LFM_{BB}(n\Delta f))\exp(j\varepsilon(t_0)) \quad (8).$$

The approximation signal is multiplied by the complex conjugate signal to thereby remove the quadratic phase of the approximation signal and leave only the phase error $$S_{BB}(n\Delta f)*LFM_{BB}*(n\Delta f)=\exp(j\varepsilon(t_0)) \quad (9)$$

DESCRIPTION OF THE INVENTION

Figure 1:
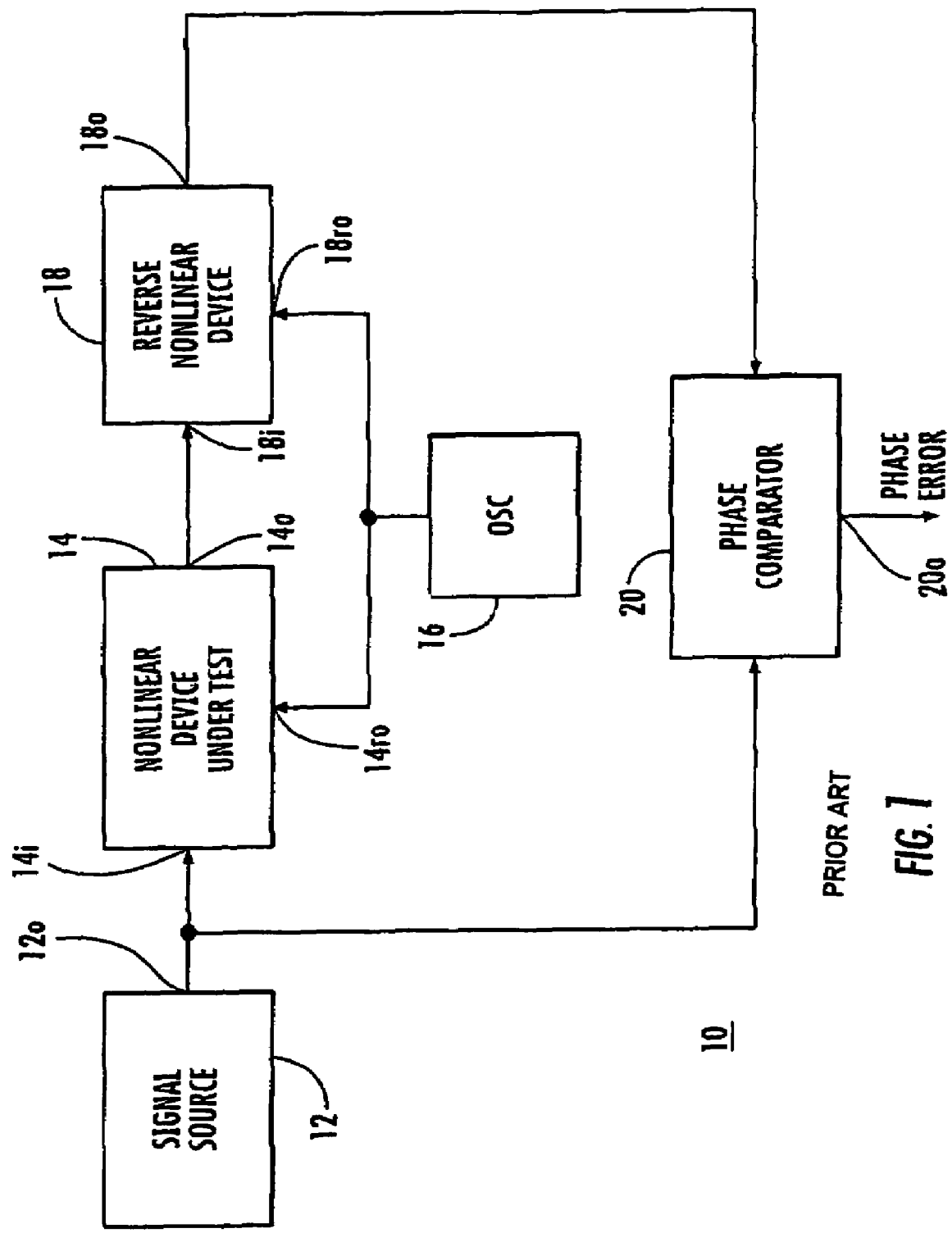
FIG. 1 is a simplified block diagram of a prior-art arrangement for determining phase error in the context of a nonlinear device.

In FIG. 1, a system 10 includes a source 12 of analog test signal. In one embodiment, the test signal is a linear-FM signal. The analog test signal is applied from output port 12*o* to the input port 14*i* of a nonlinear analog device 14 which is under test. In at least some contexts, the nonlinear device 14 may be an upconverter, which receives at its reference oscillator port 14*ro* a reference or "local" oscillator signal from a source 16. A signal is generated at the output port 14*o* of upconverter 14 which is analog linear FM at a frequency different from the frequency of the input signal at port 14*i*, together with distortion attributable to the imperfections of the nonlinear device 14.

The upconverted, distorted analog signal appearing at output port 14*o* of upconverter 14 of FIG. 1 is applied to the input port 18*i* of a nonlinear device or downconverter 18. In order to tend to minimize errors attributable to variations in the local oscillator signal between the two nonlinear devices 14 and 18, the same identical local oscillator signal from oscillator 16 is applied to the reference oscillator port 18*ro* of downconverter 18. Downconverter 18 produces an analog output signal at its output port 18*o* which includes a distorted replica of the original test signal output from signal source 12.

The distorted replica signal appearing at output port 18*o* of downconverter 18 is compared in a phase comparator 20 with the original test signal from source 12 to thereby produce an indication of the phase error at an output port 20*o*. Those skilled in the art will recognize that, at least in the context of a linear-FM test signal, the phase error produced at output port 20*o* will be in the form of amplitude versus time, where the amplitude represents the magnitude of the phase error, and time is the duration of the linear FM sweep.

Those skilled in the art will recognize that the arrangement of FIG. 1 is much simplified, in that effects such as time or path delay, and the presence of additional frequency components, are not taken into account. Nevertheless, the principles underlying the prior-art phase measurement techniques are revealed.

Figure 2:
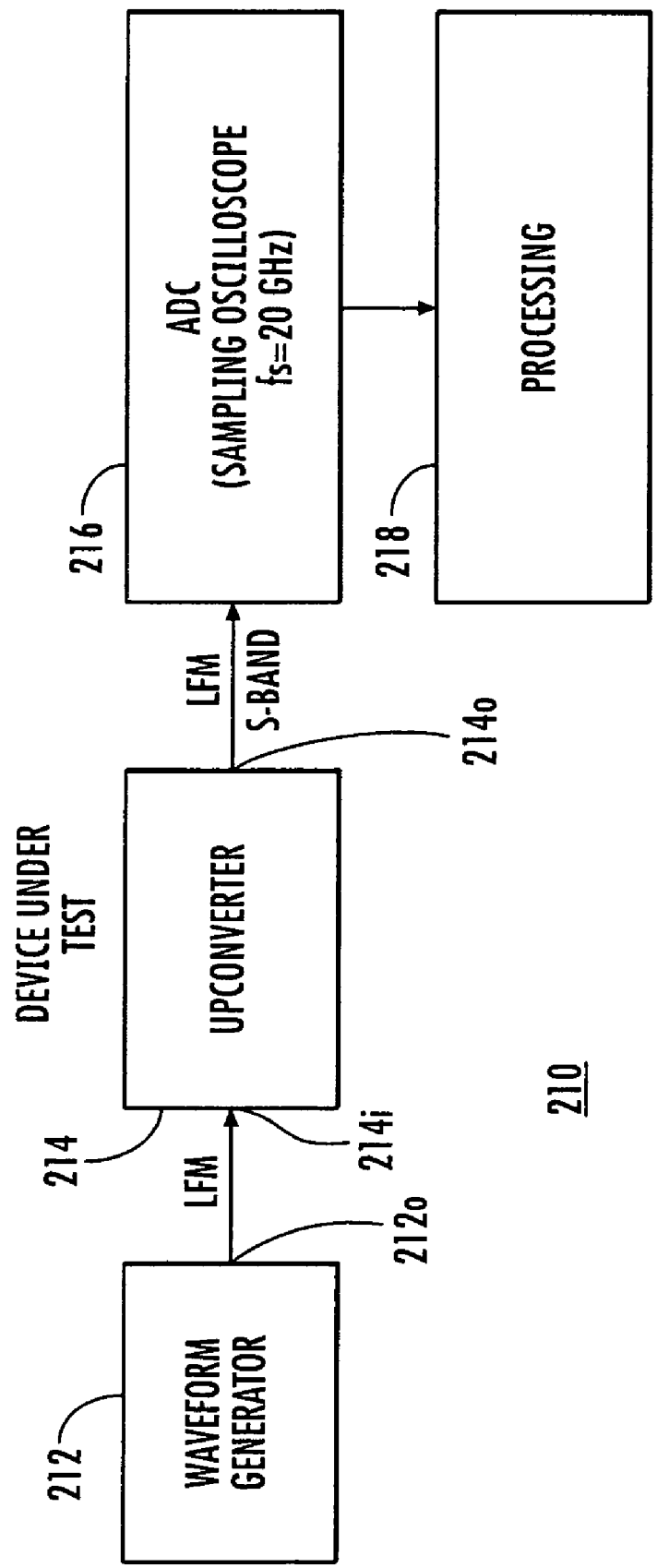
FIG. 2 is a simplified block diagram of a system including a nonlinear device under test according to an aspect of the invention, which system includes a waveform generator.

FIG. 2 is a simplified block diagram of a system 210 which is used according to a method of the invention to determine the phase error of a nonlinear frequency-modifying device. In FIG. 2, a test signal generator 212 produces at its output port 212*o* an analog test signal for application to input port 214*i* of the nonlinear analog device 214. The phase of the analog device 214 is to be tested or determined. In FIG. 2, the nonlinear analog device 214 is designated as a frequency upconverter, but it can be any analog nonlinear signal processor. Test signal generator 212 can generate any type of signal. The preferred test signals are FM (frequency modulated) signals, and in this example the test signal is a linear-FM (LFM) signal, which sweeps through a plurality of frequencies as a function of time, ideally with constant or almost-constant amplitude. An ideal LFM waveform with a starting frequency, $f_0$, a chirp rate $\mu$, and pulse duration, $T_{PW}$, has the real waveform representation $$lfm(t, f_0, \mu) = \cos\left[2\pi\left(f_0 t + \frac{\mu}{2}t^2\right)\right] \quad 0 \le t \le T_{PW} \quad (1)$$

The output of the upconverter 214 of FIG. 2 in response to the linear-FM signal applied to its input port 214*i* is an approximately linear-FM analog signal appearing at output port 214o. The approximately linear-FM signal is at a frequency other than that of the input linear-FM signal. In the example, the output frequency is in the range of 3 to 4 gigahertz (GHz). At the output port 214o of the upconverter 214, the S-band signal is modified by being shifted in frequency by $\Delta f_{device}=f_1-f_0$ from the ideal LFM represented by Equation (1), and modified by some unknown phase distortion designated $\epsilon(t)$. The analog output signal at port 214o can be represented by $$s(t, f_1, \mu) = \cos\left[2\pi\left(f_1 t + \frac{\mu}{2}t^2 + \varepsilon(t)\right)\right], 0 \le t \le T_{PW} \quad (2)$$

The approximately-linear-FM signal is applied to a digitizer or analog-to-digital converter (ADC) 216 for sampling and conversion to digital form, so that the phase error $\epsilon(t)$ can be determined by digital processing. In one possible embodiment, the digitizer 216 is a sampling oscilloscope, which makes the digitized signal available at an output port for further processing. Those skilled in the art know that a signal must be sampled at a frequency or rate greater than twice its bandwidth, in order to reduce the effects of aliasing and to generate a proper digital representation of the signal $s(t, f_1, \mu)$ of Equation (2). This is not an issue when, as here, the A/D sampling rate, fs=20 GHz, is several times the Nyquist rate.

The S-band signal obtained at the sampling times $k\Delta t$ can be expressed as $$s(k\Delta t, f_1, \mu) = \cos\left[2\pi\left(f_1 k\Delta t + \frac{\mu}{2}(k\Delta t)^2 + \varepsilon(k\Delta t)\right)\right] \quad (3)$$

where $k=0, \ldots, N_{PW}$, and $T_{PW}=N_{PW}\cdot\Delta t$ and $\Delta t=1/fs$. It will be understood that the processing in block 218 is performed digitally.

The digitized signal represented by Equation (3) is applied to a digital processor illustrated as a block 218 in FIG. 2. The digital processor processes the signals. To simplify the determination of the phase distortion, $\epsilon(t)$, it is helpful to consider only the positive frequency complex exponential form of Equation (3). This can be accomplished by taking the discrete Hilbert transform, HT, of the sampled signal. To obtain the complex exponential form given by Equation (4), the real signal is added with its Hilbert transform.

$$s(k\Delta t) = s(k\Delta t) + jHT(s(k\Delta t)) = \exp\left(j2\pi\left(f_1 k\Delta t + \frac{\mu}{2}(k\Delta t)^2 + \varepsilon(k\Delta t)\right)\right) \quad (4)$$

where $k=0, \ldots, N_{PW}$.

Those skilled in the art of signal processing will recognize that for Equation (4) to hold, the signal bandwidth must be less than one half the sampling frequency. This condition is readily satisfied by the FM waveforms of interest here.

The signal represented by Equation (4) is centered at S-band. This signal is mathematically converted in digital processor 218 to a baseband signal by multiplying Equation (4) by $\exp(-j2\pi f_c k\Delta t)$, where $f_c=f_1+B/2$ is the S-band waveform center frequency and $B=\mu T_{PW}$ is the LFM pulse bandwidth. The baseband distorted signal is of the form:

$$s_{BB}(k\Delta t) = \exp\left(j2\pi\left(-\frac{B}{2}k\Delta t + \frac{\mu}{2}(k\Delta t)^2 + (\varepsilon(k\Delta t))\right)\right) \quad (5)$$

Figure 3:
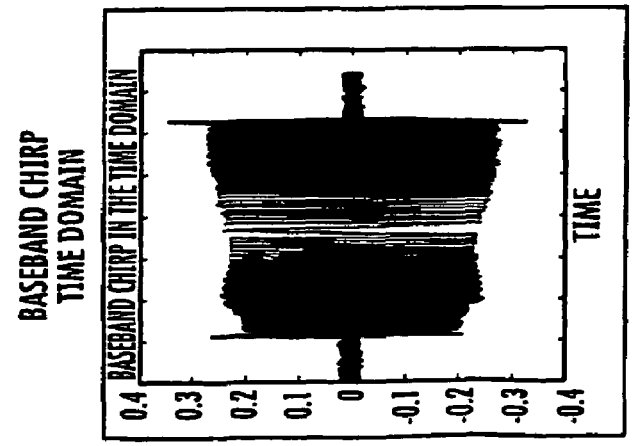
FIG. 3 represents the baseband chirp in the time domain, corresponding to the signal produced by the waveform generator of FIG. 2.

FIG. 3 illustrates the baseband "chirp" in the time domain resulting from downconversion of the digitized signal.

Figure 4:
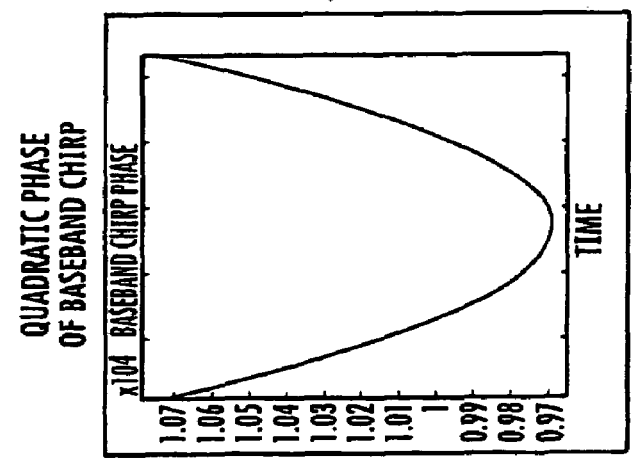
FIG. 4 is a plot of quadratic phase of the baseband chirp of FIG. 3.

Phase unwrapping accumulates the values of a sequence of phase measurements in radians, but changes or modifies absolute jumps greater than pi to their 2*pi complement. FIG. 4 represents an unwrapped phase of the chirp of FIG. 3, to produce an approximately quadratic phase versus time plot. At this point in the processing the phase error can still not be extracted. The method for obtaining the phase error is described below.

The FFT of the baseband distorted signal represented by Equation (5) is taken and this yields $$S_{BB}(n\Delta f)=FFT(s_{BB}(k\Delta t)) \quad (6)$$

The complex conjugate of the FFT of an ideal LFM replica is also generated at baseband. This is given by Equation (7).

$$LFM_{BB}*(n\Delta f)=\text{conj}[FFT(LFM_{BB}(k\Delta t))] \quad (7)$$

It should be noted that waveform generator 212 is an analog device, and is subject to error, so it is not an ideal waveform generator. The error attributed to the upconverter 214 will include whatever error actually exists between an ideal LFM and the actual LFM. High quality waveform generators, such as are in use in most RF labs today, are of such quality that all but a small fraction of any errors are due to the up-converter (or other non-linear) device.

To a very good approximation, for FM modulated signals with slowly varying phase errors s(t), the FFT of the phase distorted signal can be decomposed into $$S_{BB}(n\Delta f) \cong LFM_{BB}(n\Delta f)\exp(j\epsilon(t_0)) \quad (8)$$

where $t_0$ is the time at which the instantaneous frequency equals $n\Delta f$. For an ideal LFM signal at baseband, this is simply given as $t_0=T_{pw}*(n\Delta f/B)$. (Note that Equation (8) makes use of the well known method of stationary phase.) Multiplication in the frequency domain of the actual quadratic phase (containing the phase error) as represented by Equation (7) by the complex conjugate of the ideal phase, represented by Equation (8), in effect passes the actual signal (with its errors) through a filter matched to the ideal signal, so that only the phase error remains. Consequently, upon multiplication of Equations (7) and (8) in the frequency domain, equation (9) is produced $$S_{BB}(n\Delta f)*LFM_{BB}*(n\Delta f)=\exp(j\epsilon(t_0)) \quad (9)$$

where without loss of generality we assume that the LFM waveform has a constant magnitude of one, $|LFM|^2=1$.

Figure 5:
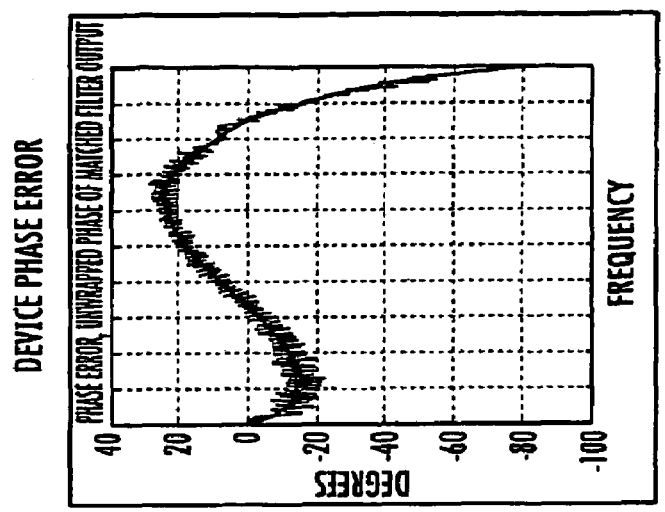
FIG. 5 is a plot of a representative device phase error obtained by matched filtering of the quadratic phase of the test baseband chirp of FIG. 4 with a filter matched to the quadratic phase of an ideal baseband chirp.
Figure 6:
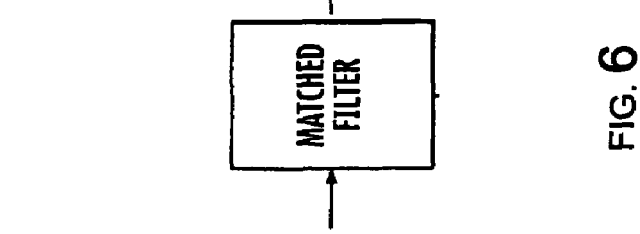
FIG. 6 is a representation of the filter matched to the quadratic phase of an ideal baseband chirp.

Finally, the phase error $\epsilon(t)$ can be obtained by phase unwrapping the output from Equation (9). FIG. 5 plots $\epsilon(t)$ for this example.

Other embodiments or variations in the test setup will be apparent to those skilled in the art. For example, any waveform generator capable of providing an LFM signal with minimal error may be used. Also other sampling methods may be used provided they meet the Nyquist sampling requirements and the input bandwidth of the signal.

A method according to an aspect of the invention is for determining the phase linearity of a nonlinear device or component. The method comprises the step of applying test signal to a nonlinear device to thereby produce desired signal. In a preferred embodiment of the invention, the test signal is a linear-FM signal. The test signal is applied to a digital emulation of the nonlinear device, to thereby produce an ideal representation of the desired signal. The phase of the desired signal is compared with that of that of the ideal representation to determine the phase error. The application of the test signal to the nonlinear device may include the application of the test signal to an upconverter, a downconverter, a frequency doubler or a frequency divider.

A method for determining the phase characteristics of a nonlinear analog device according to another aspect of the invention comprises the steps of applying a linear-FM signal to the analog device, for thereby producing desired signal with, or containing, errors, and digitizing the desired signal with errors, to thereby produce a sampled digital signal represented as $$s(k\Delta t, f_1, \mu) = \cos\left[2\pi\left(f_1 k\Delta t + \frac{\mu}{2}(k\Delta t)^2 + \varepsilon(k\Delta t)\right)\right] \quad (3)$$

where k=0, ..., $N_{PW}$, and $T_{PW}=N_{PW}\cdot\Delta t$ and $\Delta t=1/fs$. The discrete Hilbert Transform, HT, of the sampled digital signal is taken, to thereby generate a one-sided spectrum. From the one-sided spectrum, a signal is produced of the form $$\tilde{s}(k\Delta t) = s(k\Delta t) + jHT(s(k\Delta t)) = \exp\left(j2\pi\left(f_1 k\Delta t + \frac{\mu}{2}(k\Delta t)^2 + \varepsilon(k\Delta t)\right)\right) \quad (4)$$

where k=0, ..., $N_{PW}$. The one-sided spectrum is mathematically converted to a baseband signal $$s_{BB}(k\Delta t) = \exp\left(j2\pi\left(-\frac{B}{2}k\Delta t + \frac{\mu}{2}(k\Delta t)^2 + (\varepsilon(k\Delta t))\right)\right). \quad (5)$$

An FFT is taken of the baseband signal to produce a frequency component representation of the baseband signal $$S_{BB}(n\Delta f) = FFT(s_{BB}(k\Delta t)) \quad (6).$$

The complex conjugate of the FFT of an ideal Linear-FM signal at baseband is generated to produce a complex conjugate signal of the form $$LFM_{BB}*(n\Delta f) = conj[FFT(LFM_{BB}(k\Delta t))] \quad (7).$$

A frequency component representation of the baseband signal is approximated as an approximation signal $$S_{BB}(n\Delta f) \cong LFM_{BB}(n\Delta f))\exp(j\varepsilon(t_0)) \quad (8).$$

The approximation signal is multiplied by the complex conjugate signal to thereby remove the quadratic phase of the approximation signal and leave only the phase error $$S_{BB}(n\Delta f)*LFM_{BB}*(n\Delta f) = \exp(j\varepsilon(t_0)) \quad (9).$$

What is claimed is:

1. A method of selecting a nonlinear analog device from a plurality of nonlinear analog devices that exhibits least adverse effect on the phase relationships of signals entering said nonlinear analog device and the corresponding signals exiting said nonlinear analog device, said method comprising the steps of:

determining, for each of said plurality of nonlinear analog devices, the nonlinear analog device's phase linearity, said determining step comprising:

applying a test signal to said nonlinear analog device to thereby produce an analog signal containing a phase error;

digitizing said analog signal containing said phase error to produce a digital signal including said phase error said digital signal having a phase;

generating an ideal digital signal representation of said test signal, said ideal digital signal having a phase; and comparing the phase of said ideal digital signal with the phase of said digital signal including said phase error to produce a representation of said phase error, wherein said step of applying test signal to an analog nonlinear device includes the step of applying said test signal to one of a frequency doubler and a frequency divider; and selecting based on said representation of said phase error, a nonlinear analog device from said plurality of nonlinear analog devices that exhibits the smallest phase error.

2. A method of selecting a nonlinear analog device from a plurality of nonlinear analog devices that exhibits least adverse effect on the phase relationships of signals entering said nonlinear analog device and the corresponding signals exiting said nonlinear analog device, said nonlinear analog devices performing a frequency change function on signals applied thereto, said method comprising the steps of:

determining, for each of said plurality of nonlinear analog devices, the nonlinear analog device's phase linearity, said determining step comprising:

applying a test signal to said nonlinear analog device to thereby producing a desired signal including an unwanted phase error attributable to the nonlinear analog device, said desired signal having a phase;

applying said desired signal including said unwanted phase error to a digital emulation filter representing the ideal reverse of said frequency change function, to thereby produce a representation of the original test signal, including said unwanted phase error attributable to said nonlinear analog device, said representation of the original test signal having a phase; and comparing the phase of said desired signal including said unwanted phase error with the phase of said representation of said original test signal, to thereby produce a signal representing the phase error of said nonlinear analog device; and selecting based on said representation of said phase error, a nonlinear analog device from said plurality of nonlinear analog devices that exhibits the smallest phase error.

3. A method according to claim 2, wherein said test signal is a linear-FM signal.

4. A method of selecting a nonlinear analog device from a plurality of nonlinear analog devices that exhibits least adverse effect on the phase relationships of signals entering said nonlinear analog device and the corresponding signals exiting said nonlinear analog device, said method comprising the steps of:

determining, for each of said plurality of nonlinear analog devices, the nonlinear analog device's phase characteristics, said determining step comprising;

applying a linear-FM signal to said nonlinear analog device, for thereby producing a desired signal with a phase error attributable to said nonlinear analog device;

digitizing said desired signal with said phase error, to thereby produce a sampled digital signal represented as $$s(k\Delta t, f_1, \mu) = \cos\left[2\pi\left(f_1 k\Delta t + \frac{\mu}{2}(k\Delta t)^2 + \varepsilon(k\Delta t)\right)\right] \qquad (3)$$

where:
$\mu$ is the chirp rate;
k=0, ..., $N_{PW}$,
$T_{PW}=N_{PW}\cdot \Delta t$ and
$\Delta t=1/fs$;

taking the discrete Hilbert Transform, HT, of the sampled digital signal, to thereby generate a one-sided spectrum;

mathematically converting said one-sided spectrum to a baseband signal $$s_{BB}(k\Delta t) = \exp\left(j2\pi\left(-\frac{B}{2}k\Delta t + \frac{\mu}{2}(k\Delta t)^2 + (\varepsilon(k\Delta t))\right)\right) \qquad (5)$$

where B=$\mu T_{PW}$;

taking an FFT of said baseband signal to produce a frequency component representation of the baseband signal $$S_{BB}(n\Delta f)=FFT(s_{BB}(k\Delta t)) \qquad (6)$$

Including said phase error and inherent quadratic phase;

generating the complex conjugate of the FFT of an ideal linear-FM signal at baseband to produce a complex conjugate signal of the form $$LFM_{BB}*(n\Delta f)=\text{conj}[FFT(LFM_{BB}(k\Delta t))] \qquad (7);$$

approximating said frequency component representation of the baseband signal as an approximation signal $$S_{BB}(n\Delta f)\cong LFM_{BB}(n\Delta f))\exp(j\epsilon(t_0)) \qquad (8); \text{ and}$$

multiplying said approximation signal by said complex conjugate signal to thereby remove said quadratic phase of said approximation signal and leave only said phase error $$S_{BB}(n\Delta f)*LFM_{BB}*(n\Delta f)=\exp(j\epsilon(t_0)) \qquad (9); \text{ and}$$

selecting based on said phase error, a nonlinear analog device from said plurality of nonlinear analog devices that exhibits the smallest phase error.

5. A method of selecting a nonlinear analog device from a plurality of nonlinear analog devices that exhibits least adverse effect on the phase relationships of signals entering said nonlinear analog device and the corresponding signals exiting said nonlinear analog device, said method comprising the steps of:

determining, for each of said plurality of nonlinear analog devices, the nonlinear analog device's phase characteristics, said determining step comprising;

applying a linear-FM signal to said nonlinear analog device, for thereby producing a desired signal with a phase error;

digitizing said desired signal with said phase error, to thereby produce a sampled digital signal;

taking the discrete Hilbert Transform, of the sampled digital signal, to thereby generate a one-sided spectrum;

mathematically converting said one-sided spectrum into a baseband signal;

taking an FFT of said baseband signal to produce a frequency component representation of the baseband signal including said phase error and inherent quadratic phase;

generating the complex conjugate of the FFT of an ideal linear-FM signal at baseband to produce a complex conjugate signal;

approximating said frequency component representation of the baseband signal; and multiplying said approximation signal by said complex conjugate signal to thereby remove said quadratic phase of said approximation signal and leave only said phase error; and selecting, based on said phase error, a nonlinear analog device from said plurality of nonlinear analog devices that exhibits the smallest phase error.

* * * * *

UNITED STATES PATENT AND TRADEMARK OFFICE
CERTIFICATE OF CORRECTION

| | | |
|---|---|---|
| PATENT NO. | : 7,272,521 B1 | |
| APPLICATION NO. | : 11/058520 | |
| DATED | : September 18, 2007 | |
| INVENTOR(S) | : Peter L. Delos, David B. Zaff and Matthew W. Smith | |

It is certified that error appears in the above-identified patent and that said Letters Patent is hereby corrected as shown below:

In Column 1, line 3 please insert the following:

-- GOVERNMENTAL INTEREST

This invention was made with Government support under Contract N00024-03-C-6110 awarded by the Department of the Navy. The Government has certain rights in this invention. --

Signed and Sealed this
Twenty-eighth Day of August, 2012

David J. Kappos
*Director of the United States Patent and Trademark Office*